(12) United States Patent
Higuchi et al.

(10) Patent No.: US 8,779,778 B2
(45) Date of Patent: Jul. 15, 2014

(54) PROXIMITY SWITCH

(75) Inventors: Toshiyuki Higuchi, Kusatsu (JP);
Teruyuki Nakayama, Kusatsu (JP);
Daichi Kamisono, Ritto (JP); Satoshi Nishiuchi, Hirakata (JP); Kazunori Okamoto, Kusatsu (JP)

(73) Assignee: OMRON Corporation, Kyoto-shi (JP)

( * ) Notice: Subject to any disclaimer, the term of this patent is extended or adjusted under 35 U.S.C. 154(b) by 343 days.

(21) Appl. No.: 13/257,902

(22) PCT Filed: Apr. 27, 2010

(86) PCT No.: PCT/JP2010/057430
§ 371 (c)(1),
(2), (4) Date: Oct. 27, 2011

(87) PCT Pub. No.: WO2010/126029
PCT Pub. Date: Nov. 4, 2010

(65) Prior Publication Data
US 2012/0032690 A1    Feb. 9, 2012

(30) Foreign Application Priority Data

Apr. 28, 2009  (JP) .................................. 2009-109117

(51) Int. Cl.
| | |
|---|---|
| *G01R 27/28* | (2006.01) |
| *G01R 27/32* | (2006.01) |
| *H03K 17/94* | (2006.01) |
| *H03K 17/95* | (2006.01) |
| *H03K 17/945* | (2006.01) |
| *H03K 17/97* | (2006.01) |
| *G01B 7/14* | (2006.01) |
| *G01B 7/30* | (2006.01) |
| *G01N 27/72* | (2006.01) |
| *G01R 33/00* | (2006.01) |
| *G01B 7/04* | (2006.01) |

(52) U.S. Cl.
CPC ............ *H03K 17/94* (2013.01); *H03K 17/9502* (2013.01); *H03K 17/945* (2013.01); *H03K 17/97* (2013.01); *H03K 17/95* (2013.01); *H03K 2017/9706* (2013.01); *H03K 2217/960755* (2013.01); *G01B 7/046* (2013.01)
USPC ................. 324/629; 324/207.26; 324/207.17; 324/226; 340/552

(58) Field of Classification Search
CPC . H03K 17/94; H03K 17/9502; H03K 17/945; H03K 17/97; H03K 2017/9706; H03K 17/95; H03K 2217/960755; G01B 7/046
USPC ............... 324/629, 633, 658, 207.12, 207.15, 324/207.16, 207.17, 207.26, 260, 654–657; 340/572.1, 572.2, 522, 552, 553, 554, 340/545.1; 331/65, 74
See application file for complete search history.

(56) References Cited

U.S. PATENT DOCUMENTS

| | | | | | |
|---|---|---|---|---|---|
| 4,771,359 | A | * | 9/1988 | Link | 361/179 |
| 5,012,206 | A | * | 4/1991 | Tigges | 331/65 |
| 5,254,879 | A | * | 10/1993 | Jackson | 307/116 |
| 5,291,152 | A | * | 3/1994 | Seale | 331/65 |
| 5,896,278 | A | * | 4/1999 | Tamura et al. | 363/20 |
| 6,212,052 | B1 | | 4/2001 | Heuer et al. | |
| 6,409,083 | B1 | | 6/2002 | Link | |
| 6,603,306 | B1 | * | 8/2003 | Olsson et al. | 324/207.26 |
| 6,995,729 | B2 | * | 2/2006 | Govari et al. | 343/867 |
| 2004/0012493 | A1 | * | 1/2004 | Park | 340/545.1 |
| 2006/0181417 | A1 | | 8/2006 | Pullmann et al. | |

FOREIGN PATENT DOCUMENTS

| | | |
|---|---|---|
| EP | 1 181 776 B1 | 2/2002 |
| JP | 2000-106071 A | 4/2000 |
| JP | 2002-501698 A | 1/2002 |
| JP | 2006-528323 A | 12/2006 |

* cited by examiner

*Primary Examiner* — Huy Q Phan
*Assistant Examiner* — Raul Rios Russo
(74) *Attorney, Agent, or Firm* — Marvin A. Motsenbocker; Mots Law, PLLC

(57) ABSTRACT

Disclosed is a proximity switch provided with an actuator unit and a sensor unit. The sensor unit is provided with an antenna coil, a transmitting circuit which transmits electromagnetic waves at a constant frequency to the antenna coil, a receiving circuit which detects external signals received by means of the antenna coil, and control circuits. The actuator unit is provided with an antenna coil, a power supply circuit which rectifies an electromotive force generated in the antenna coil, and a signal processing circuit which receives power supply from the power supply circuit, performs frequency-dividing to the signals received by means of the antenna coil, and transmits the signals from the antenna coil after the frequency-dividing. The control circuit of the sensor unit has memory for registering the frequency of the signals transmitted from the actuator unit. The control circuit determines whether the actuator unit is in proximity to the sensor unit or not by checking the received signals detected by means of the receiving circuit with the operations of the transmitting circuit and the frequency registered in the memory.

12 Claims, 8 Drawing Sheets

PROXIMITY SWITCH

TECHNICAL FIELD

The present disclosure relates to a proximity switch provided with an actuator unit attached to an object that moves, and a sensor unit, fixedly arranged at a position capable of being in proximity to the actuator unit, for detecting the actuator unit by performing a non-contact communication with the actuator unit and outputting a signal indicating presence or absence of such detection.

BACKGROUND ART

A proximity switch that exchanges information for identification by carrying out a non-contact communication between the sensor unit and the actuator unit according to the principle of electromagnetic induction is being developed as a proximity switch used for safety management purposes such as detecting the opening and closing of doors to dangerous regions (see patent documents 1, 2).

Specifically, patent document 1 describes arranging a memory for storing identification code in the actuator unit (operation element) and the sensor unit (reading head), so that the sensor unit communicates with the actuator unit to read out the identification code on the actuator unit side and checks such identification code with the identification code in the memory of its own circuit to determine the presence or absence of the actuator unit (see pages 7 to 9, FIG. 2 of patent document 1).

Patent document 2 discloses a proximity switch having a configuration in which a transmitting antenna coil and a receiving antenna coil are arranged in both the sensor unit and the actuator unit, so that signals of different frequencies are transmitted and received between the antenna coils. In such proximity switch, an externally input digital code signal is modulated by a predetermined frequency to be transmitted to the actuator unit in the sensor unit, and the signal received by the actuator unit is decoded to a digital code signal and then such digital code signal is modulated by a frequency different from that of the signal from the sensor unit to be transmitted to the sensor unit. In the sensor unit, the signal transmitted from the actuator unit is decoded to the digital code signal, and the presence or absence of the actuator unit is determined by whether or not such signal matches the original digital code signal. The frequencies of the signal transmitted from the sensor unit and the signal transmitted from the actuator unit are set to be different so that each signal can be transmitted without interfering with the other (see paragraphs 0023 to 0036, FIGS. 1 to 3 of patent document 2).

Patent Document 1: Japanese Patent Publication No. 2002-501698
Patent Document 2: European Patent Publication EP1181776 B1

DISCLOSURE OF THE INVENTION

Problems to be Solved by the Invention

In the proximity switch disclosed in patent document 1, different identification codes may be set for every combination of the sensor unit and the actuator unit, so that the sensor unit does not determine that the actuator unit is in proximity and prevents the switch function from being disabled at high certainty unless combined with the correct actuator unit. However, in such proximity switch, an IC including a memory and a CPU needs to be installed in the actuator unit, and communication based on the principle of RFID needs to be carried out between the sensor unit and the actuator unit, and hence the configuration becomes expensive with complicated processes.

In the proximity switch disclosed in patent document 2, the circuit configuration is complicated, the shape is large, and the cost is high since the transmitting coil and the receiving coil are arranged in the sensor unit and the actuator unit, respectively.

In light of the foregoing problems, an embodiment aims to provide a proximity switch in which the circuit configuration and the mechanism of signal processing are simple, and the accuracy of detection is ensured.

Means for Solving the Problem

In accordance with one aspect, a proximity switch includes an actuator unit to be attached to a moving object, and a sensor unit for performing a process of detecting the actuator unit in a non-contact manner and outputting a signal indicating presence or absence of the detection, the actuator unit including a first antenna coil and the sensor unit including a second antenna coil. In the sensor unit, a transmitting circuit for driving the second antenna coil to transmit an electromagnetic wave of a constant frequency and a receiving circuit for detecting an external signal received by the second antenna coil are connected to the second antenna coil. In the actuator unit, a power supply circuit for rectifying an electromotive force generated in the first antenna coil to supply power and a signal processing circuit for frequency-dividing a signal received by the first antenna coil upon receiving the power supplied from the power supply circuit and transmitting the frequency-divided signal from the first antenna coil are connected to the first antenna coil.

The sensor unit also includes a control circuit incorporating a memory for registering frequencies of signals transmitted from the actuator unit. The control circuit checks a received signal detected by the receiving circuit upon operation of the transmitting circuit and the frequencies registered in the memory while controlling the operation of the transmitting circuit to determine whether or not the actuator unit is in proximity to the sensor unit.

According to the above configuration, both antenna coils are electromagnetically coupled when the actuator unit is in proximity to the sensor unit, the signal processing circuit is operated by the electromotive force generated by the antenna coil on the actuator unit side, and a signal having a frequency lower than the electromagnetic wave is transmitted to the sensor unit. This transmitted signal is generated by frequency-dividing the signal received by the antenna coil, and hence the circuit configuration on the actuator unit side is simplified. Furthermore, the process of transmitting the electromagnetic wave of a constant frequency and the process of detecting the signal received by the antenna coil and checking the frequency thereof merely need to be carried out on the sensor unit side, so that a complex process of superimposing an identification code on the electromagnetic wave and transmitting or decoding the identification code from the received signal is not needed.

In the proximity switch according to another aspect, the signal processing circuit of the actuator unit includes a counter circuit for frequency-dividing the signal received by the first antenna coil, and is adapted to amplitude modulate the electromagnetic wave generated in the first antenna coil in accordance with a cycle of a signal output from the counter circuit. The receiving circuit of the sensor unit includes a detector circuit for detecting an envelope curve of the signal flowing in the second antenna coil.

According to such aspect, the counter circuit operates in a state in which both antenna coils are electromagnetically coupled when the actuator unit is in proximity to the sensor unit, and the amplitude of the electromagnetic wave and the signal flowing through both antenna coils is modulated in accordance with the cycle of the signal output from the counter circuit. The signal frequency-divided by the counter circuit can be retrieved as a received signal in the sensor unit when the detector circuit in the receiving circuit of the sensor unit detects the signal component of the modulated portion.

In the proximity switch according to still another aspect, the control circuit of the sensor unit alternately executes enabling of the transmitting circuit for a constant period and disabling of the transmitting circuit for a constant period, and determines a state in which the frequency of the signal received by the receiving circuit during the period the transmitting circuit is enabled matches the frequency registered in the memory and the receiving circuit does not detect level change in the received signal during the period the transmitting circuit is disabled as a condition for determining that the actuator unit is in proximity to the sensor unit.

According to the above aspect, determination that the actuator unit is in proximity occurs only when the actuator unit correctly responds to the operation and pause of the transmitting circuit and the frequency of the signal received while the electromagnetic wave is being transmitted matches the frequency registered in the memory. Therefore, false detection can be prevented when the circuit of the sensor unit or the actuator unit breaks down or when receiving signals from a device at the periphery of the sensor unit.

Furthermore, when desiring to enhance the disablement function of the switch, either the actuator unit configured to frequency-divide the ratio of the signal processing circuit can be changed or one of the plurality of actuator units in which the frequency-dividing ratio of the signal processing circuit differs may be introduced. In yet another aspect, when using such actuator units, the control circuit of the sensor unit includes a registration processing means for detecting the frequency from a signal detected by the receiving circuit while the transmitting circuit is operating under a predetermined condition and registering the detected frequency in the memory.

According to the above aspect, the frequency of the signal transmitted from the actuator unit to the sensor unit can be changed according to the combination of the sensor unit and the actuator unit. During attachment of the proximity switch, or the like, the frequency of the signal transmitted from the actuator unit can be easily registered in the memory of the sensor unit by bringing the sensor unit and the actuator unit close and transmitting the electromagnetic wave from the sensor unit.

Therefore, according to the above aspect, even if an illegitimate actuator unit is sensed by the sensor unit, false detection of such unit can be prevented, thus preventing disablement the switch function.

Effect of the Invention

According to one of the aspects, the signal flowing to the antenna coil is frequency-divided and transmitted to the sensor unit in the actuator unit as a result of the electromagnetic wave transmitted from the sensor unit. So a signal of a specific frequency can be transmitted from the actuator unit to the sensor unit and the sensor unit can determine the presence or absence of the actuator unit from the transmitted signal.

Hence the actuator unit can be accurately detected with a simple circuit configuration and signal processing. A proximity switch for safety purposes and security management can be provided at low cost. Attachment can be facilitated and used in various applications since the sensor unit and the actuator unit can be miniaturized.

BEST MODE FOR CARRYING OUT THE INVENTION

Figure 1:
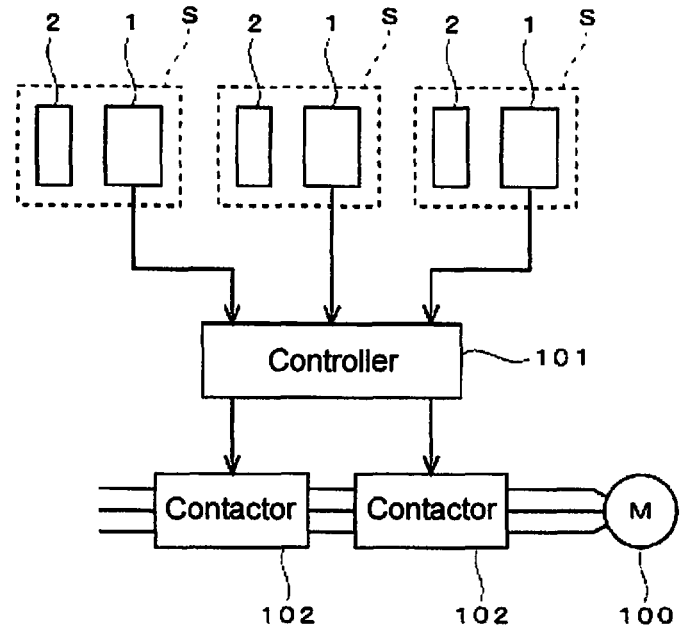
FIG. 1 is a block diagram showing a configuration example of a safety management system using a proximity switch.
Figure 2:
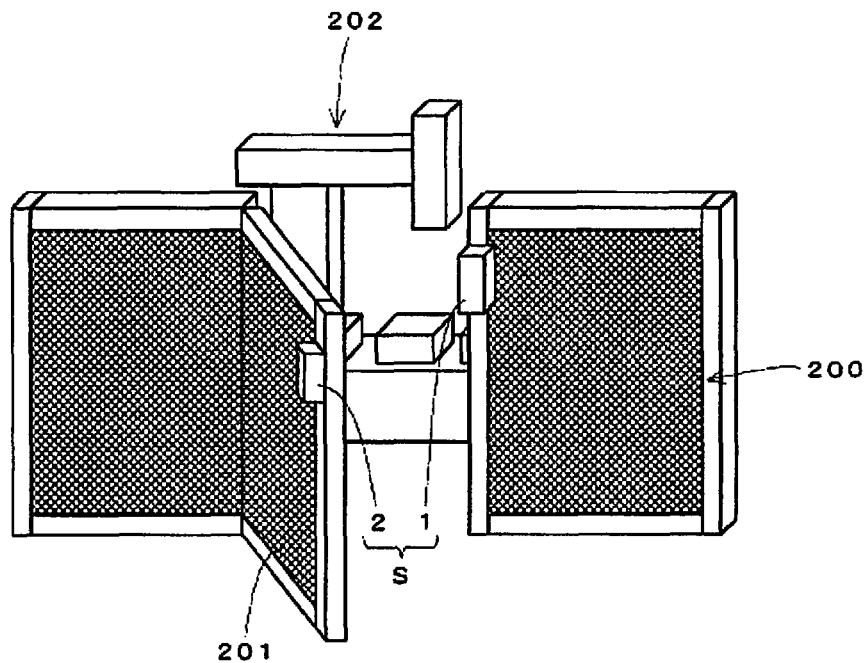
FIG. 2 is an explanatory view showing an attachment example of the proximity switch.

FIG. 1 and FIG. 2 show a configuration example of a safety management system introduced to the manufacturing premises.

The purpose of the safety management system is to stop motor 100 that operates robot 202 when fence 200 surrounding a dangerous region is opened, and is configured by a plurality of proximity switches S (three in FIG. 1), a contactor 102 (two in FIG. 1) for connecting the motor 100 to a power supply (not shown), a controller 101 for controlling the operation of each contactor 102, and the like.

Each proximity switch S is includes a sensor unit 1 and an actuator unit 2.

As shown in FIG. 2, the actuator unit 2 is attached to an edge on the open side of a door 201 of the fence 200, and the sensor unit 1 is attached to a position facing and being in proximity to the actuator unit 2 when the door 201 is closed. As shown in FIG. 1, the sensor unit 1 is electrically connected to the controller 101.

In the example, as shown in FIG. 2, opening and closing of one door 201 is detected by the set of sensor unit 1 and actuator unit 2, but this is not the only possible case, and a plurality of sets of sensor unit 1 and actuator unit 2 may be attached to one door 201. Furthermore, as shown in FIG. 3, the sensor unit 1 may be attached to one of the double doors 201A, 201B and the actuator unit 2 may be attached to the other one to detect the opening and closing of each door 201A, 201B.

Figure 3:
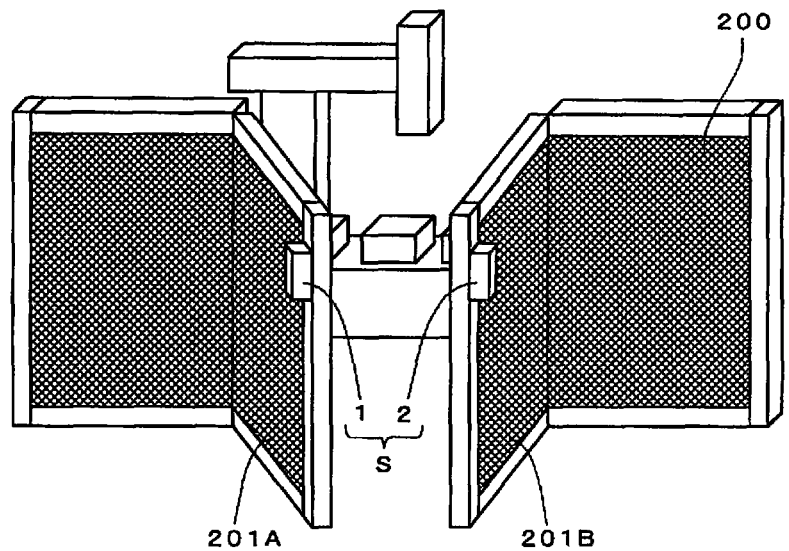
FIG. 3 is an explanatory view showing another attachment example of the proximity switch.

Although not illustrated, the opening and closing can be detected for a sliding door, similar to FIGS. 2 and 3.

The sensor unit 1 of each proximity switch S executes a process of detecting the corresponding actuator unit 2, and outputs a signal (hereinafter referred to as "detection signal") indicating the detection result The output detection signal is input to the controller 101.

In the controller 101, the detection signal input from the sensor unit 1 of each proximity switch S may be analyzed, and each contactor 102 may be set to an excitation state if all the detection signals indicate a state in which the actuator unit 2 is detected. Power is thereby supplied to the motor 100, so that the robot 202 in the dangerous region operates. If a detection signal indicates a state in which the actuator unit 2 is not detected, the controller 101 sets each contactor 102 to a non-excitation state. Power supply to the motor 100 is thereby prevented, and operation of the robot 202 is stopped.

In each proximity switch S, non-contact communication is carried out between the sensor unit 1 and the actuator unit 2 to transmit a signal of a specific frequency between them. One of the proximity switches S will be focused on below, and the configuration and the operation thereof will be described in detail.

Figure 4:
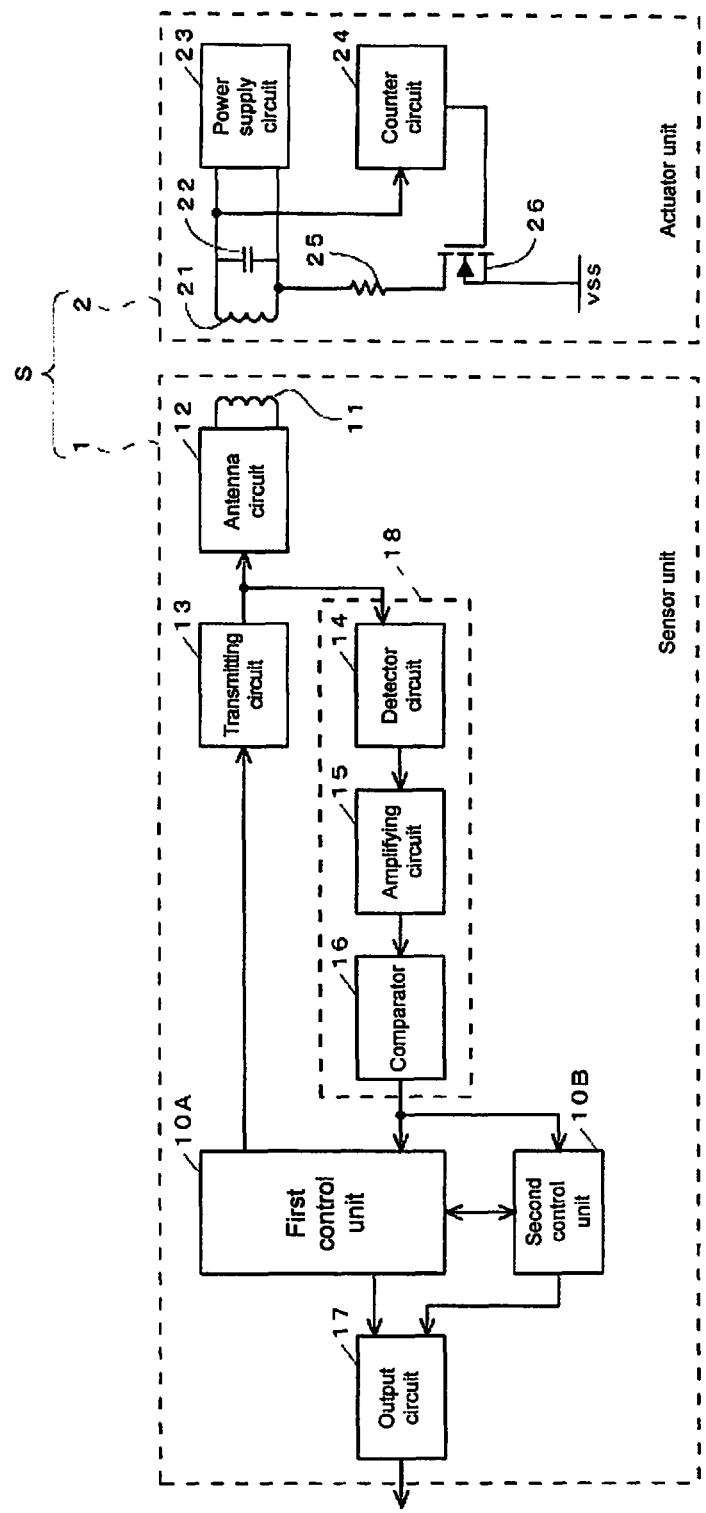
FIG. 4 is a block diagram showing an electrical configuration of the proximity switch.

FIG. 4 shows an electrical configuration of the proximity switch S.

The sensor unit 1 includes an antenna coil 11, an antenna circuit 12 (circuit for impedance matching), a transmitting circuit 13, and a receiving circuit 18 for communication with the actuator unit 2 and for signal processing, and also includes two control units 10A, 10B, and an output circuit 17 for outputting the detection signal. When individually referring to each control unit 10A, 10B, the control unit 10A is referred to as "first control unit 10A" and the control unit 10B is referred to as "second control unit 10B".

Each control unit 10A, 10B includes a CPU and a nonvolatile memory. Furthermore, the first control unit 10A includes an oscillator circuit for generating a transmitted signal, where the signal of a constant frequency (hereinafter referred to as X Hertz, e.g., X=125 kHz) is provided to the transmitting circuit 13 by the oscillation circuit. In the transmitting circuit 13, processes such as amplification are performed on the relevant signal to generate the transmitted signal of X Hertz. The transmitted signal is provided to the antenna coil 11 through the antenna circuit 12, and sent out as an electromagnetic wave.

The receiving circuit 18 includes a detector circuit 14, an amplifying circuit 15, and a comparator 16. The detector unit 14 detects an envelope curve of the signal flowing to the antenna circuit 12 to detect the external signal received by the antenna coil 11. The received signal is amplified by the amplifying circuit 15, and then converted to a pulse signal by the comparator 16 and input to each control unit 10A, 10B.

In each control unit 10A, 10B, the presence or absence of the actuator unit 2 is determined using the received signal input from the comparator 16 while mutually synchronizing of operations with each other. A signal of high level is output when it is determined that the actuator unit 2 is present, and a signal of low level is output when it is determined that the actuator unit 2 is absent. In the output circuit 17, the AND operation of the signal output from each control unit 10A, 10B is output as the detection signal. Therefore, the detection signal is high level only when both control units 10A, 10B determine that the actuator unit 2 is present.

A resonance circuit by the antenna coil 21 and the capacitor 22, a power supply circuit 23, a counter circuit 24, a resistor 25, and a circuit including a field effect transistor 26 are incorporated in the actuator unit 2.

When the door 201 is closed, the actuator unit 2 is in a state proximate to the sensor unit 1, and the electromagnetic wave is output from the sensor unit 1, both antenna coils 11, 21 are electromagnetically coupled so that the AC signal of X Hertz also flows to the antenna coil 21 of the actuator unit 2. The power supply circuit 23 generates power for driving the counter circuit 24 by rectifying the electromotive force of the antenna coil 21. The counter circuit 24 frequency-divides the signal of X Hertz flowing to the antenna coil 21 at a predetermined ratio to output a pulse signal of Y Hertz. This pulse signal is input to the gate of the transistor 26, so that the antenna coil 21 is connected to a constant voltage VSS through the resistor 25 and the transistor 26.

The above connection is repeated in a cycle (1/Y second) corresponding to the output from the counter circuit 24. The electromagnetic wave between the antenna coils 11, 21 in the coupled state and the signal flowing to each antenna coil 11, 21 are amplitude modulated at the cycle of 1/Y second. The signal component of the modulated portion is detected by the detector circuit 14 as a received signal.

Summarizing the signal processing described above, the sensor unit 1 sends the electromagnetic wave of X Hertz from the antenna coil 11 regardless of whether or not the actuator unit 2 is proximate. If the actuator unit 2 is in proximity to the sensor unit 1, the signal of Y Hertz is generated from the signal received by the sensor unit 1 in the actuator unit 2 caused by the electromagnetic wave, which signal is then transmitted to the sensor unit 1 through the electromagnetic wave. In the sensor unit 1, the received signal of Y Hertz is detected by the receiving circuit 18, and the detected received signal is input to each control unit 10A, 10B.

Figure 5:
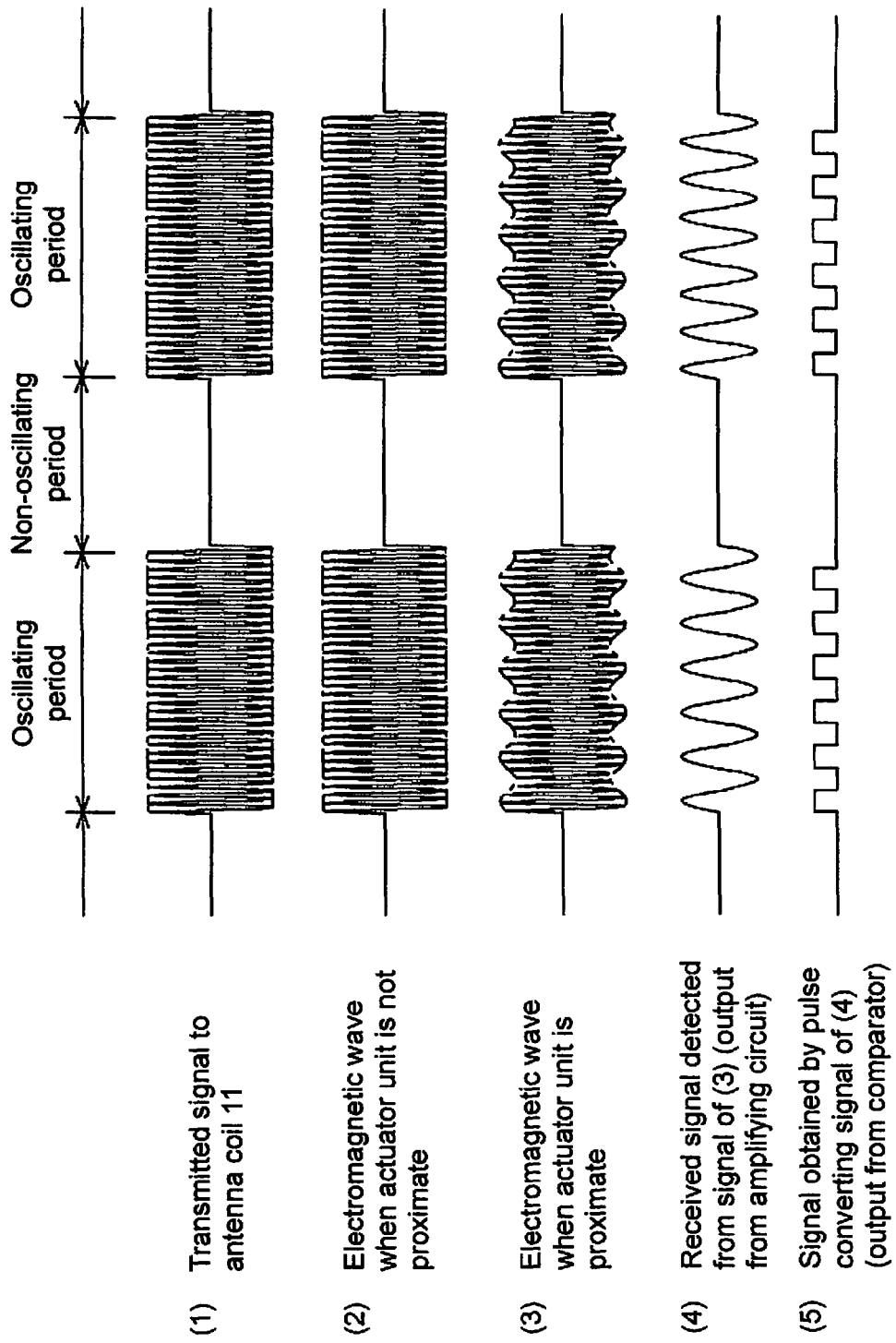
FIGS. 5(1) to 5(5) are timing charts showing a specific example of signal processing in the sensor unit.

FIG. 5 is a timing chart showing a specific example of signal processing in the sensor unit 1 of the proximity switch S. In the figure, (1) is the transmitted signal generated by the transmitting circuit 13, (2) is the electromagnetic wave when the actuator unit 2 is not proximate, and (3) is the electromagnetic wave when the actuator unit 2 is proximate. The signals of the antenna coils 11, 21 are also in the state similar to FIGS. 5(2) and 5(3).

(4) is the received signal detected by amplifying with the amplifying circuit 15 after detecting the envelope curve (shown with chain dashed line) of the signal of (3) with the detector circuit 14. (5) is obtained by pulse converting the received signal of (4) by the comparator 16.

As shown in FIG. 5(1), a period of outputting the transmitted signal of X Hertz (this period is hereinafter referred to as "oscillating period" since it is carried out by the oscillation of the oscillation circuit in the first control unit 10A) and a period of stopping the output of the transmitted signal (hereinafter referred to as "non-oscillating period") are alternately set. The modulation of the signal does not occur in the state in which the actuator unit 2 is not in proximity to the sensor unit 1, and hence the electromagnetic wave is similar to the transmitted signal, as shown in FIG. 5(2).

If the actuator unit 2 is in proximity to the sensor unit 1, the actuator unit 2 reacts to the transmitted signal during the oscillating period, and hence the modulation occurs in the electromagnetic wave during the oscillating period and the received signal of Y Hertz is detected from such signal, as shown in FIGS. 5(3), (4), and (5). In the non-oscillating period, however, the actuator unit 2 does not operate, and hence the received signal barely changes and the frequency of the signal output from the comparator 16 becomes 0 Hertz.

The frequency Y of the signal transmitted from the actuator unit 2 is registered in advance in the memory of each control unit 10A, 10B of the sensor unit 1. In each control unit 10A, 10B, the received signal in each period is checked with the operation of its own circuit and the frequency Y in the memory while setting the oscillating period and the non-oscillating period to determine the absence and presence of the actuator unit 2.

Figure 6:
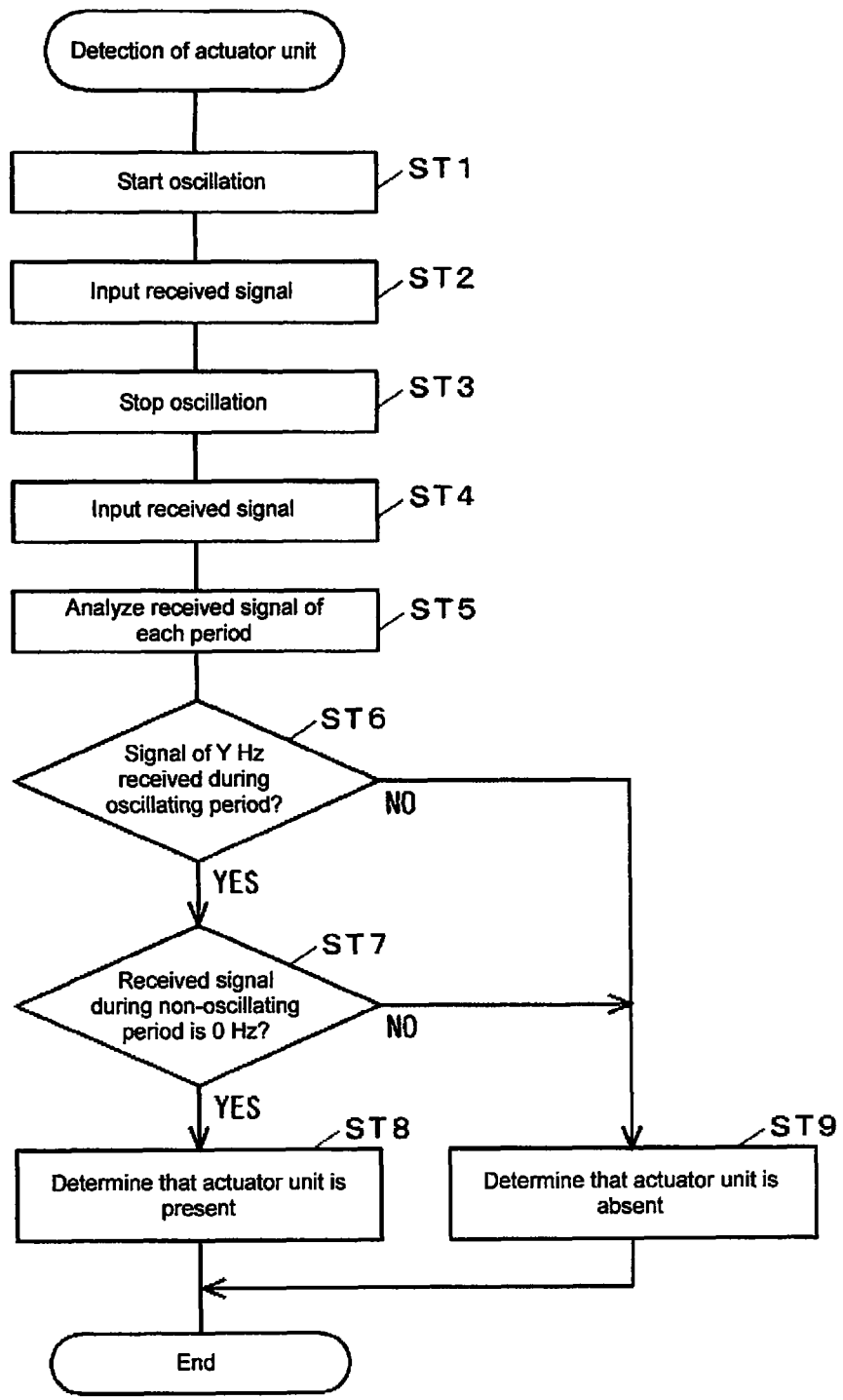
FIG. 6 is a flowchart showing the procedure of the detection process of the actuator unit.

FIG. 6 shows a specific procedure executed by each control unit 10A, 10B for the detection of the actuator unit 2. Describing with reference to the number (ST1 to ST9) of each step of the flowchart, the oscillation circuit is first started (step ST1), and the received signal is input from the comparator 16 until elapse of a predetermined time while maintaining such state (step ST2). The oscillation circuit is then stopped (step ST3), and the received signal is input from the comparator 16 until elapse of a predetermined time while maintaining such state (step ST4).

The oscillating period and the non-oscillating period for one cycle are executed by the processes of steps ST1 to ST4. Each step of ST1 and ST3 is actually executed only by the first control unit 10A, but the timing to start and stop of the oscillation is also recognized in the second control unit 10B in accordance with the operation of the first control unit 10A.

After the oscillating period and the non-oscillating period for one cycle are executed, the received signal in each period is analyzed in step ST5. Here, determination is made that the actuator unit 2 is present (step ST8) if the received signal during the oscillating period regularly changes with the frequency of Y Hertz ("YES" in step ST6) and the received signal of the no-oscillating period is 0 Hertz ("YES" in step ST7). If the signal received during the oscillating period is not Y Hertz ("NO" in step ST6), or if the signal having a frequency greater than 0 is received even during the pause period ("NO" in step ST7), determination is made that the actuator unit 2 is absent (step ST9).

Figure 7:
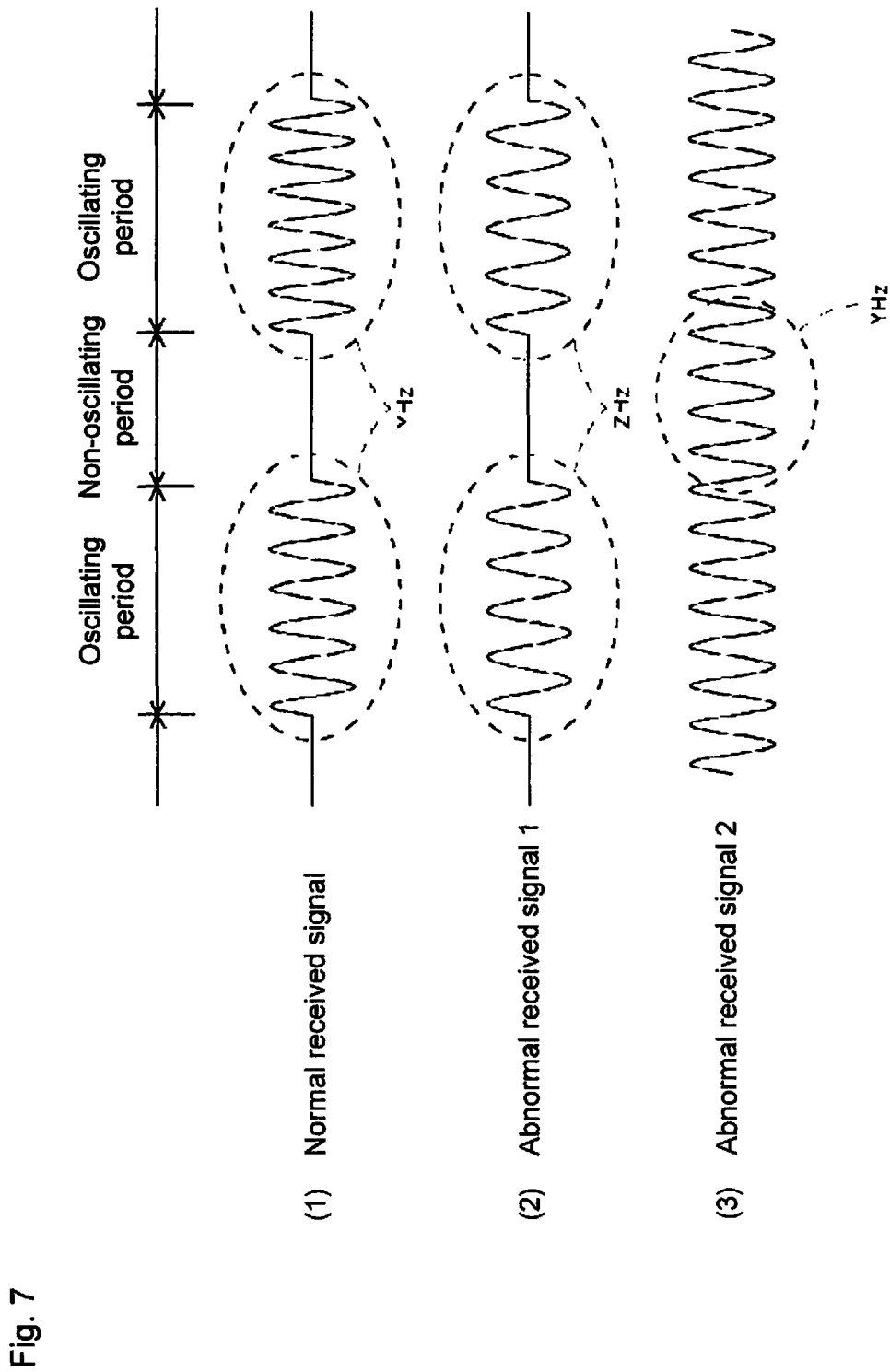
FIGS. 7(1) to 7(3) are timing charts comparing a normal received signal and an abnormal received signal.

FIG. 7 shows, in comparison, each example of (1) when a normal signal is received, (2) when a signal having a frequency (Z Hertz) different from the Y Hertz is received during the oscillating period, and (3) when the received signal is fluctuating during the pause period with respect to the received signal (indicated by signal after detection/amplification) detected in each period above.

If an abnormality occurs as shown in FIG. 7(2), there is a possibility the circuit on the received side of the actuator unit 2 or the sensor unit 1 is broken, or the device that operates in resonance with the electromagnetic wave exists at the periphery of the sensor unit 1. If an abnormality occurs as shown in FIG. 7(3), there is a possibility the transmitting circuit 13 or the antenna circuit 12 of the sensor unit 1 is broken. Alternatively, there is also a possibility a device that self-performs oscillation exists at the periphery of the sensor unit 1.

In this example, all determination is made that the actuator unit 2 is absent and the detection signal of low level is transmitted to the controller 10 if a signal in a state different from that shown in FIG. 7(1) is detected, and hence the robot 202 is reliably stopped and the safety is ensured irrespective of the cause of the abnormality.

Figure 8:
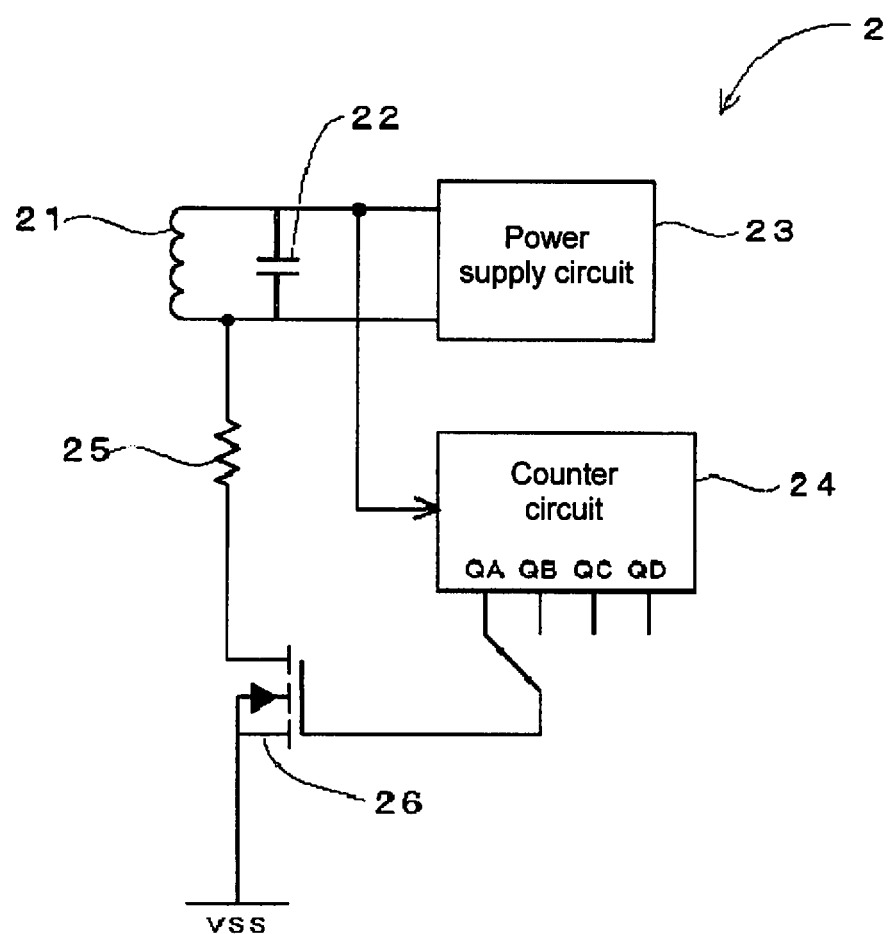
FIG. 8 is a view showing an actuator unit having a configuration in which the frequency of the transmitted signal is changeable.

FIG. 8 shows another configuration example of the actuator unit 2.

The actuator unit 2 in this example is similar to that shown in FIG. 4 in the basic circuit configuration, but performs four frequency-divions by frequency-dividing ratios as a counter circuit 24, and includes output terminals QA, QB, QC, QD for individually outputting the signal generated by each frequency-division. The gate of the transistor 26 is connected to one of the output terminals QA, QB, QC, QD.

According to the above configuration, the frequency of the signal transmitted from the actuator unit 2 to the sensor unit 1 can be differentiated depending on which one of the output terminals is connected to the transistor 26. Therefore, even if the actuator unit 2 of the same model as the legitimate actuator unit 2 is brought close to the sensor unit 1, the switch function will not be disabled unless the frequency of the signal transmitted from the relevant actuator unit 2 does not match that of the legitimate actuator unit 2. Therefore, it becomes difficult to disable the switch function, and the safety can be further enhanced.

When adopting the configuration of FIG. 8, the counter circuit 24 and the transistor 26 may be connected at the time of manufacture and made unchangeable, but a switch mechanism may be arranged between the transistor 26 and the counter circuit 24, and the switch mechanism may be appropriately operated by an external signal or a switch arranged in the housing of the actuator unit 2 so that the frequency can be changed.

With respect to the actuator unit 2 having the configuration of FIG. 4, one of a plurality of counter circuits having different frequency-dividing ratios may be selected and incorporated as the counter circuit 24 so that a plurality of actuator units 2 in which the frequency of the transmitted signal respectively differs can be produced, and one of them can be incorporated in the sensor unit 1.

Figure 9:
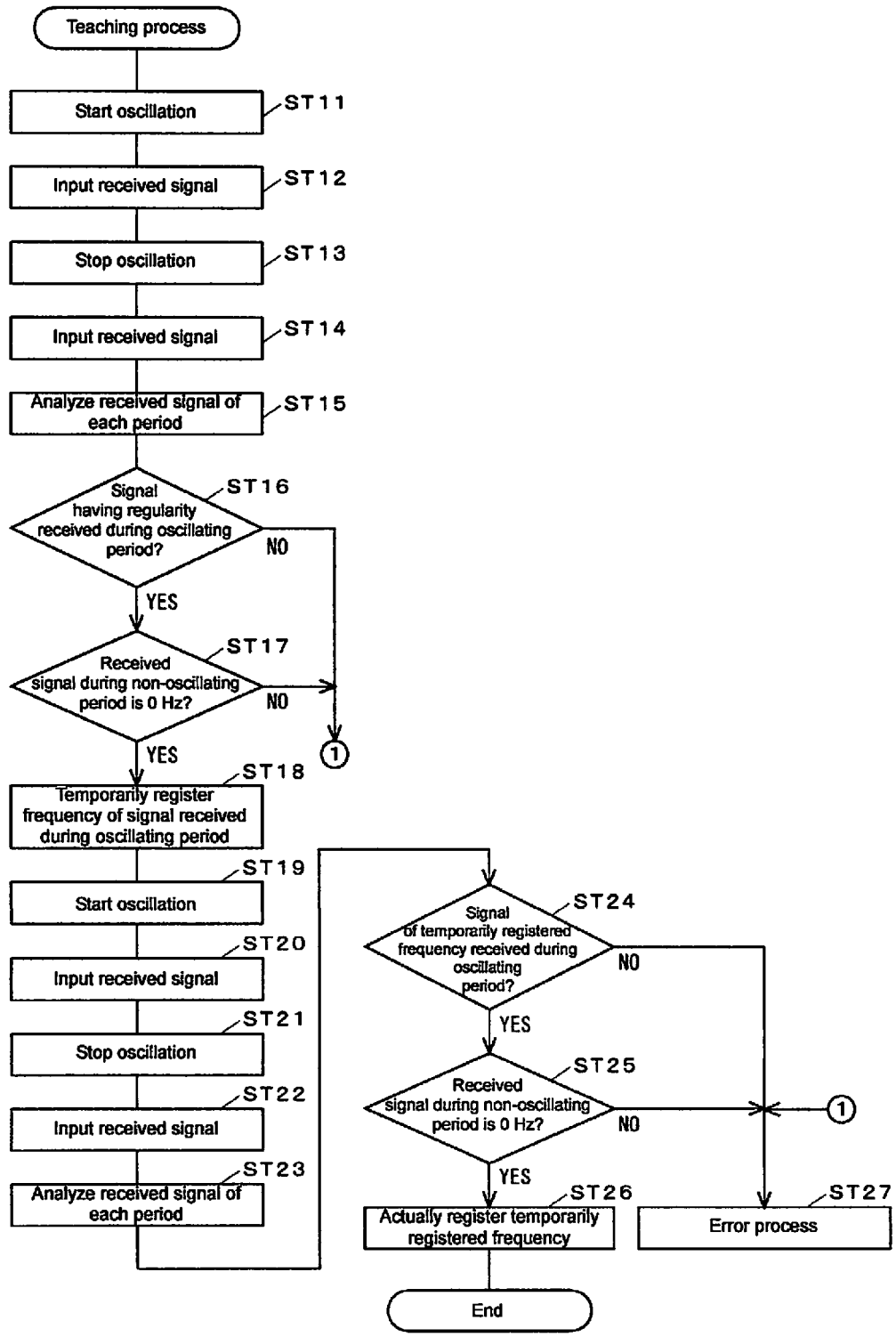
FIG. 9 is a flowchart showing the procedure of a process of registering the frequency of the transmitted signal of the actuator unit.

If the frequency of the transmitted signal is differentiated depending on the actuator unit 2, shipping is carried out without registering the frequency in each control unit 10A, 10B of the sensor unit 1, and a process of registering the frequency is desirably carried out after attaching the proximity switch S in the field. FIG. 9 shows a procedure regarding the registration process (teaching).

The teaching process of FIG. 9 is executed by attaching the sensor unit 1 in which the frequency is not registered and the actuator unit 2 to the door 201, closing the door 201, and supplying power to the sensor unit 1.

This process is also simultaneously executed in the two control units 10A, 10B, similar to the detection process of the actuator unit 2 shown in FIG. 6. Describing with reference to FIG. 9, the oscillating period and the non-oscillating period are first alternately executed, and the received signal in each period is input and analyzed (steps ST11 to 15). The signal having regularity other than 0 Hertz is received during the oscillating period ("YES" in step ST16), and the received signal during the non-oscillating period is 0 Hertz ("YES" in step ST17), the frequency of the signal received during the oscillating period is temporarily registered (step ST18).

In the teaching process, the oscillating period and the non-oscillating period are executed one more cycle, and the received signal in each period is input and analyzed (steps ST19 to 23). The signal having the same frequency as the temporarily registered frequency is received during the oscillating period ("YES" in step ST24), and the received signal during the non-oscillating period is 0 Hertz ("YES" in step ST25), the temporarily registered frequency is actually registered (step ST26). When the sensor unit 1 is re-started thereafter, the detection process shown in FIG. 6 is executed using the registered frequency in the sensor unit 1.

Therefore, in the teaching process, the oscillating period and the non-oscillating period are executed for two cycles, and the frequency of the signal received in each oscillating period is registered in the memory under the condition that the frequency of the signal received in the oscillating period of each cycle matches and that the received signal does not fluctuate in the non-oscillating period of each cycle (however, the cycle to be executed is not limited to two cycles, and three or more cycles may be executed). If the signal received during the first oscillating period is irregular ("NO" in step ST16) or if the frequency of the signal received in the second oscillating period does not match the temporarily registered frequency ("NO" in step ST24), or if the signal having a frequency greater than 0 is received during the non-oscillating period ("NO" in step ST17 or step ST25), an alarm is output, for example, as an error process (step ST27).

According to the teaching process, the frequency does not need to be registered to each control unit 10A, 10B of the sensor unit 1 before shipping, and the frequency corresponding to the combined actuator unit 2 can be registered during attachment, so that convenience can be enhanced. Furthermore, even if the frequency of the signal from the actuator unit 2 is changed after the frequency is registered, the registered frequency can be reset by the signal from the controller 101 or by the operation of the switch arranged in the housing of the sensor unit 1, and the teaching process can be executed. Input of the signal instructing re-registration of the frequency to the sensor unit 1 or the setting of a special wiring in the sensor unit 1 may be the trigger of the teaching process.

INDUSTRIAL APPLICABILITY

According to the proximity switch of the above configuration, the sensor unit 1 and the actuator unit 2 both have a simple circuit configuration, and the presence or absence of the actuator unit can be accurately determined by analyzing the frequency of the received signal while alternately repeating the period in which the electromagnetic wave of X Hertz is transmitted and the period in which such transmission is paused. Therefore, it can be provided at low cost while ensuring the performance of the proximity switch.

As the circuit configuration is simplified, the sensor unit 1 and the actuator unit 2 both can be miniaturized, and attachment becomes easier. Therefore, applications of detecting a moving object such as a robot hand in addition to safety purposes and security management can be achieved.

DESCRIPTION OF SYMBOLS

S proximity switch
1 sensor unit
2 actuator unit
10A first control unit
10B second control unit
11, 21 antenna coil
13 transmitting circuit
14 detector circuit
18 receiving circuit
24 counter circuit
26 transistor

The invention claimed is:

1. A proximity switch comprising an actuator unit to be attached to an object, and a sensor unit for detecting the actuator unit without contact and for outputting a signal indicating said detection, the actuator unit comprising a first antenna coil, and the sensor unit comprising a second antenna coil; wherein
the sensor unit comprises a transmitting circuit for driving the second antenna coil to transmit an electromagnetic wave at a constant frequency and a receiving circuit for detecting an external signal received by the second antenna coil, the transmitting circuit and the receiving circuit being connected to the second antenna;
the actuator unit comprises a power supply circuit for rectifying an electromotive force generated in the first antenna coil from the first antenna coil to produce power, and a signal processing circuit for frequency-dividing a signal received by the first antenna coil, the frequency-divided signal being transmitted by the first antenna coil and the power supply circuit and the signal processing circuit being connected to the first antenna coil; and
the sensor unit comprises a control circuit having a memory for registering a frequency of the frequency-divided signal transmitted from the actuator unit, the control circuit checking the external signal detected by the receiving circuit with operation of the transmitting circuit and the frequency registered in the memory, while controlling the operation of the transmitting circuit, to determine proximity of the actuator unit to the sensor unit.

2. The proximity switch according to claim 1, wherein
the signal processing circuit of the actuator unit comprises a counter circuit for frequency dividing the signal received by the first antenna coil,
the actuator unit is adapted to amplitude modulate an electromagnetic wave in the first antenna coil in accordance with the frequency-divided signal output from the counter circuit; and
the receiving circuit of the sensor unit comprises a detector circuit for detecting an envelope curve of the signal flowing in the second antenna coil.

3. The proximity switch according to claim 1, wherein the control circuit of the sensor unit alternately enables and disables the transmitting circuit for constant periods, and determines when a frequency of the external signal detected by the receiving circuit during enablement of the transmitting circuit matches the frequency registered in the memory and when the receiving circuit does not detect level change in the external signal during disablement of the transmitting circuit as a condition for determining proximity of the actuator unit to the sensor unit.

4. The proximity switch according to claim 1, wherein
the actuator unit is adapted to change a frequency-dividing ratio of the signal processing circuit; and
the control circuit of the sensor unit further includes a registration processing unit for detecting a frequency from a signal detected by the receiving circuit during operation of the transmitting circuit under a predetermined condition and registering the detected frequency in the memory.

5. The proximity switch according to claim 1, wherein
one of a plurality of actuator units having signal processing circuits with different frequency-dividing ratios is selected; and
the control circuit of the sensor unit further includes a registration processing unit for detecting and storing in the memory, a frequency from a signal detected by the receiving circuit.

6. The proximity switch according to claim 2, wherein the control circuit of the sensor unit alternately enables and disables the transmitting circuit for constant periods, and determines when a frequency of the external signal detected by the receiving circuit during enablement of the transmitting circuit matches the frequency registered in the memory and when the receiving circuit does not detect level change in the external signal during disablement of the transmitting circuit as a condition for determining proximity of the actuator unit to the sensor unit.

7. The proximity switch according to claim 2, wherein
the actuator unit is adapted to change a frequency-dividing ratio of the signal processing circuit; and
the control circuit of the sensor unit further includes a registration processing unit for detecting a frequency from a signal detected by the receiving circuit during operation of the transmitting circuit under a predetermined condition and registering the detected frequency in the memory.

8. The proximity switch according to claim 3, wherein
the actuator unit is adapted to change a frequency-dividing ratio of the signal processing circuit; and
the control circuit of the sensor unit further includes a registration processing unit for detecting a frequency from a signal detected by the receiving circuit during operation of the transmitting circuit under a predetermined condition and registering the detected frequency in the memory.

9. The proximity switch according to claim 6, wherein the actuator unit is adapted to change a frequency-dividing ratio of the signal processing circuit; and the control circuit of the sensor unit further includes a registration processing unit for detecting a frequency from a signal detected by the receiving circuit during operation of the transmitting circuit under a predetermined condition and registering the detected frequency in the memory.

10. The proximity switch according to claim 2, wherein one of a plurality of actuator units having signal processing circuits with different frequency-dividing ratios is selected; and the control circuit of the sensor unit further includes a registration processing unit for detecting and storing in the memory, a frequency from a signal detected by the receiving circuit.

11. The proximity switch according to claim 3, wherein one of a plurality of actuator units having signal processing circuits with different frequency-dividing ratio is selected; and the control circuit of the sensor unit further includes a registration processing unit for detecting and storing in the memory, a frequency from a signal detected by the receiving circuit.

12. The proximity switch according to claim 6, wherein one of a plurality of actuator units having signal processing circuits with different frequency-dividing ratio is selected; and the control circuit of the sensor unit further includes a registration processing unit for detecting and storing in the memory, a frequency from a signal detected by the receiving circuit.

* * * * *